United States Patent [19]

Pribat et al.

[11] Patent Number: 4,952,526
[45] Date of Patent: Aug. 28, 1990

[54] METHOD FOR THE FABRICATION OF AN ALTERNATION OF LAYERS OF MONOCRYSTALLINE SEMICONDUCTING MATERIAL AND LAYERS OF INSULATING MATERIAL

[75] Inventors: Didier Pribat, Paris; Leonidas Karapiperis, Bourg-La-Reine; Christian Collet, Limours; Guy Garry, Rueil-Malmaison, all of France

[73] Assignee: Thomson-CSF, Puteaux, France

[21] Appl. No.: 333,083

[22] Filed: Apr. 4, 1989

[30] Foreign Application Priority Data

Apr. 5, 1988 [FR] France .............................. 88 04437

[51] Int. Cl.$^5$ ............................................. H01L 21/20
[52] U.S. Cl. ........................................ 437/89; 437/90; 437/915; 437/83; 148/DIG. 164
[58] Field of Search ........................... 437/89, 915, 90; 148/DIG. 164

[56] References Cited

U.S. PATENT DOCUMENTS

| | | | |
|---|---|---|---|
| 4,619,033 | 10/1986 | Jastrzebski | 437/89 |
| 4,663,831 | 5/1987 | Birrittella et al. | 148/DIG. 164 |
| 4,725,112 | 2/1988 | Bridges et al. | |
| 4,758,531 | 7/1988 | Beyer et al. | 437/90 |
| 4,760,036 | 7/1988 | Schubert | 437/915 |
| 4,849,371 | 7/1989 | Hansen et al. | 437/90 |

OTHER PUBLICATIONS

"Mosfet Structure", T. H. Ning, V. J. Silvestri, and D. D. Tang, IBM Technical Disclosure Bulletin, vol. 25, No. 3A, Aug. 1982, pp. 1179–1182.

S. Wolf et al., *Silicon Processing for the VLSI Era*, Sunset Beach, Calif., Lattice Press, (1986), pp. 155–156.

Extended Abstracts of the 18th (1986 International) Conference on Solid State Devices and Materials, Tokyo, 1986, pp. 713–714, L. Karapiperis et al.: "Selective Epitaxial Growth of Si and In Situ Deposition of Amorphous-or Poly-Si for Recrystallization Purposes".

Journal of Applied Physics, vol. 55, No. 2, Jan. 15, 1984, pp. 519–523, D. R. Bradbury et al.: "Control of Lateral Epitaxial Chemical Vapor Deposition of Silicon Over Insulators".

Proceedings of the 4th Annual Esprit Conference, Sep. 1987, pp. 55–71, D. Chapuis et al.: "SOI Materials and Processing Towards 3D Integration".

Journal of Crystal Growth, vol. 73, 1985, pp. 73–76, Amsterdam, NL; K. Kamon et al.: "Selective Epitaxial Growth of GaAs by Low-Pressure MOVPE".

*Primary Examiner*—Brian E. Hearn
*Assistant Examiner*—Laura M. Holtzman
*Attorney, Agent, or Firm*—Oblon, Spivak, McClelland, Maier & Neustadt

[57] ABSTRACT

A method for making a layer of monocrystalline, semiconducting material on a layer of insulating material is disclosed. For this, epitaxial growth is achieved in a cavity closed by layers of dielectric materials, using seeds of monocrystalline, semiconducting material of a substrate. This method thus enables a 3D integration of semiconductor components.

21 Claims, 12 Drawing Sheets

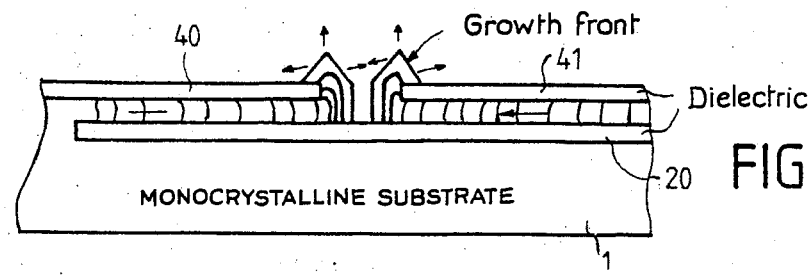
FIG_20
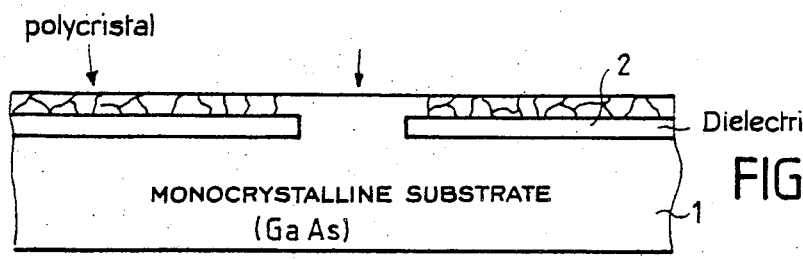
FIG_21
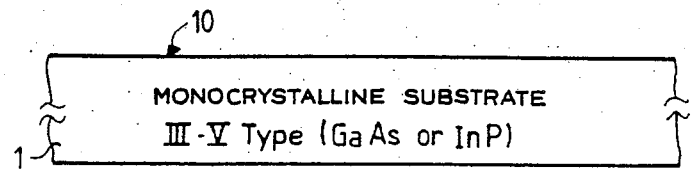
FIG_22
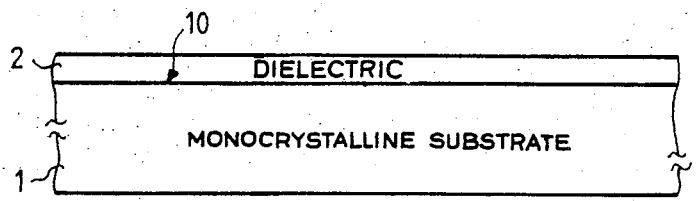
FIG_23
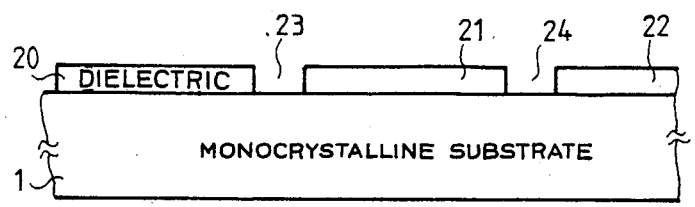
FIG_24
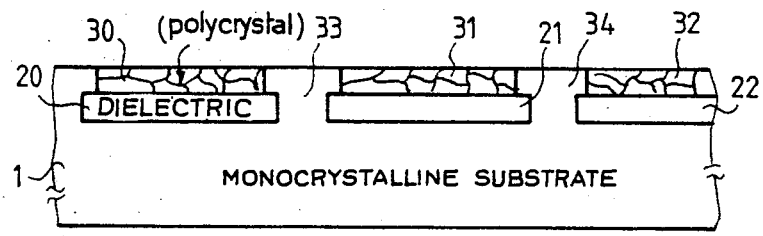
FIG_25

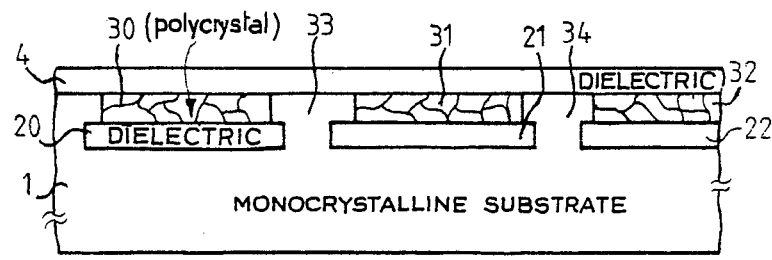
FIG_26
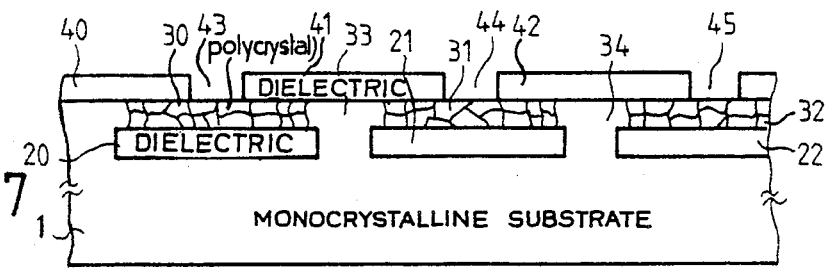
FIG_27
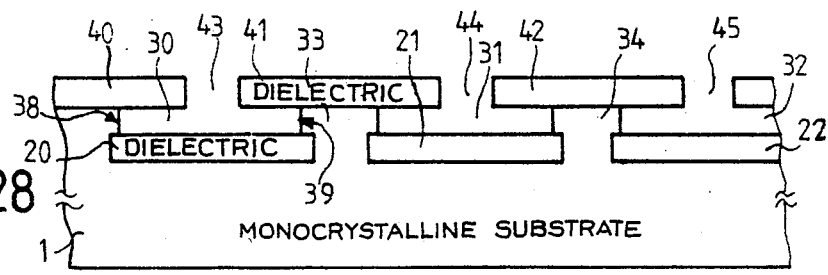
FIG_28
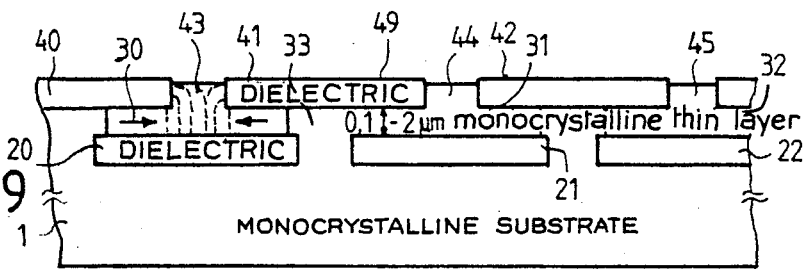
FIG_29

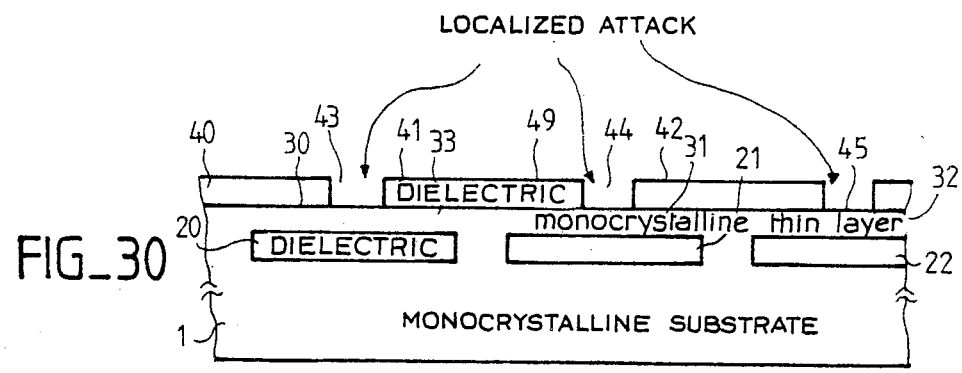
FIG_30
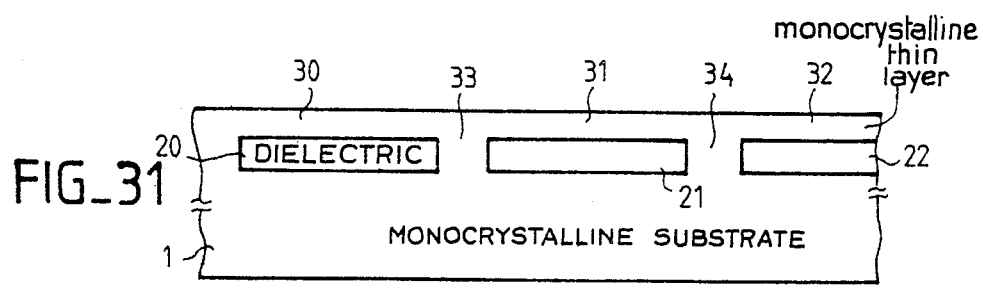
FIG_31
FIG_32
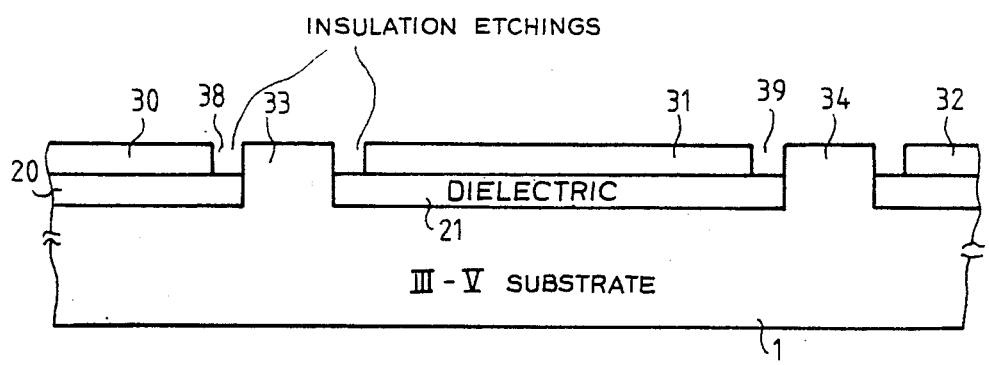

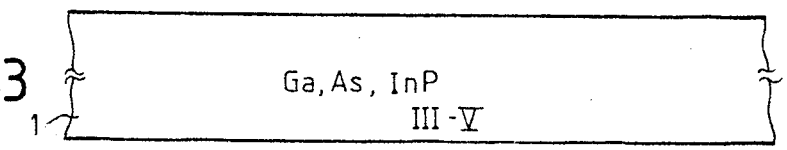
FIG_33
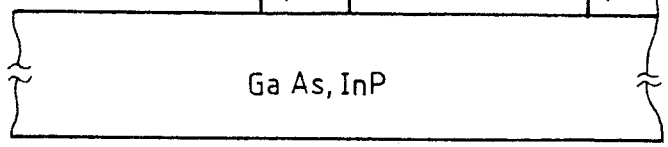
FIG_34
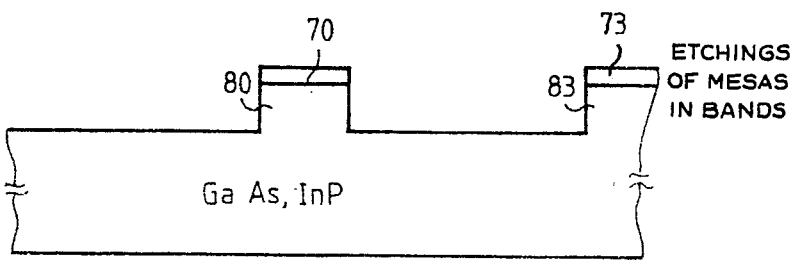
FIG_35
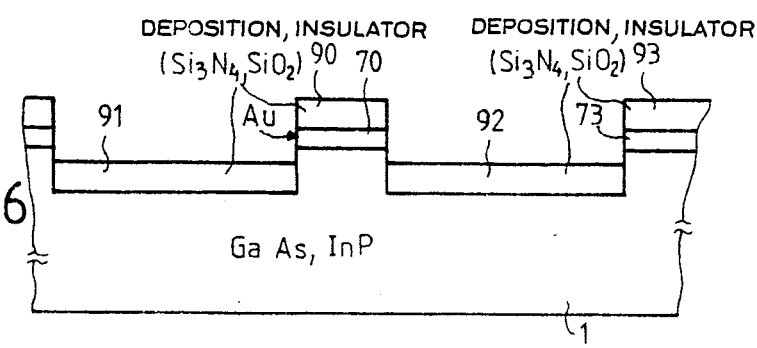
FIG_36
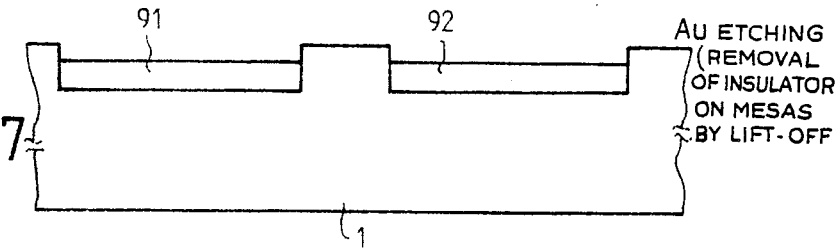
FIG_37

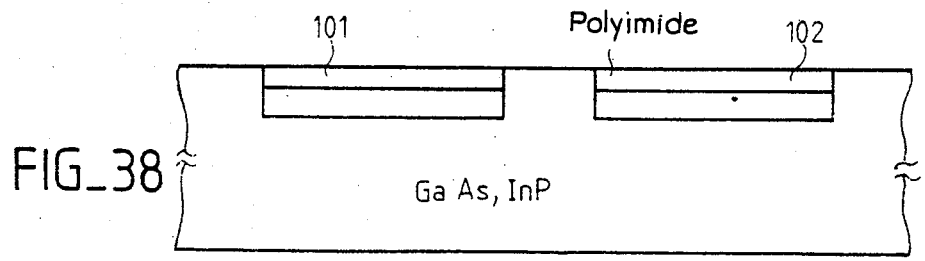
FIG_38
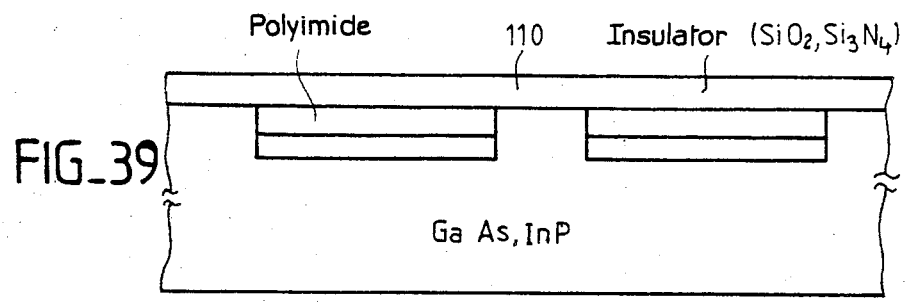
FIG_39
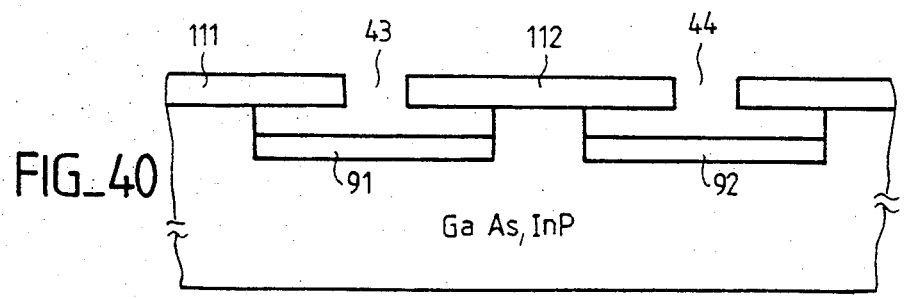
FIG_40
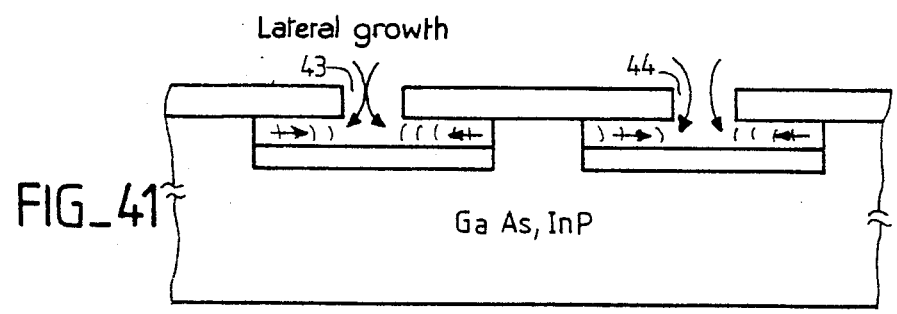
FIG_41

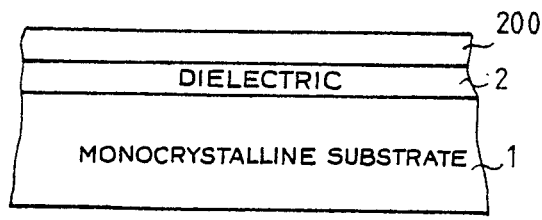
FIG_42
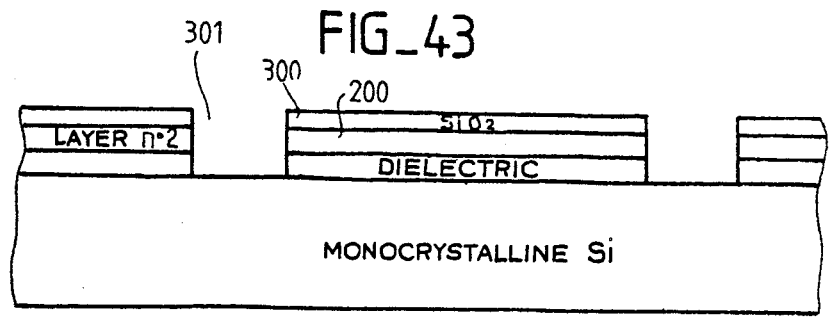
FIG_43
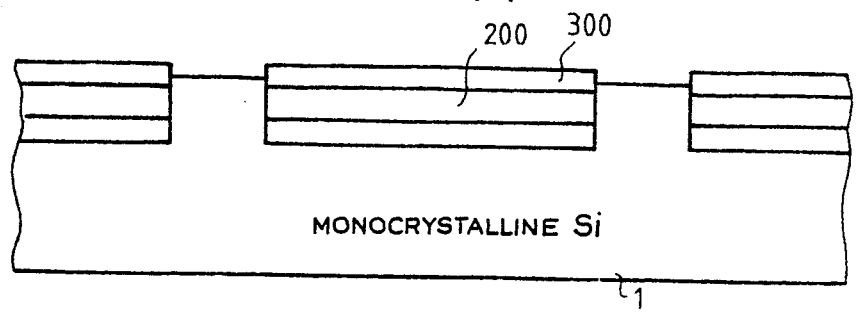
FIG_44
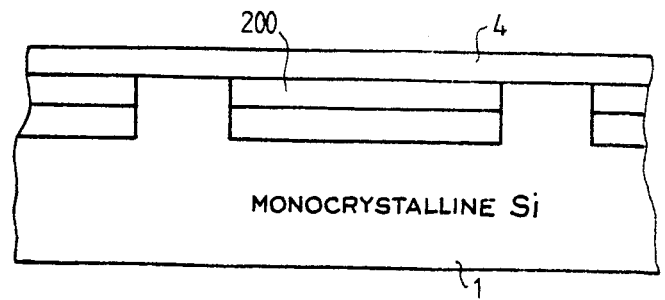
FIG_45

FIG_46
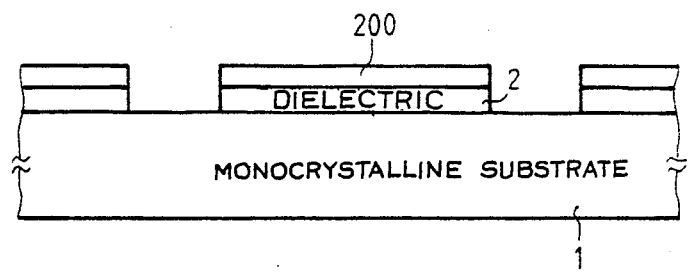
FIG_47
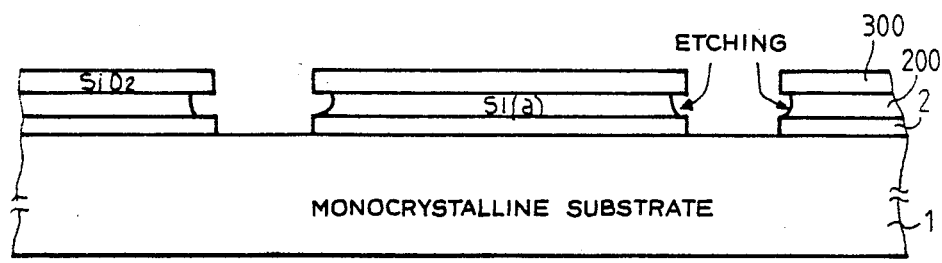
FIG_48
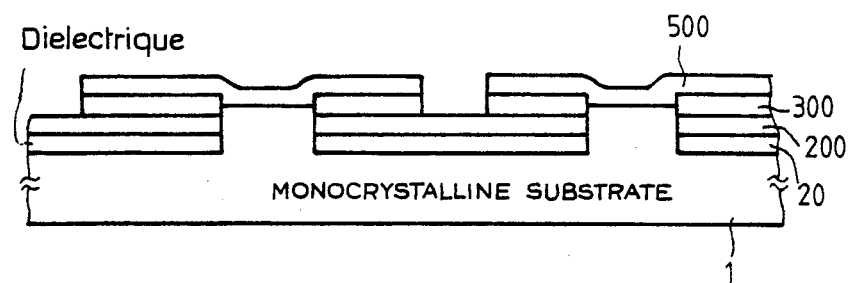

FIG_49
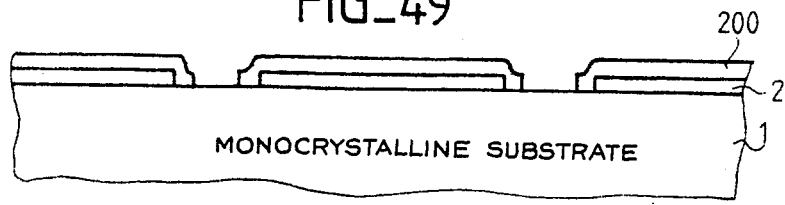
FIG_50
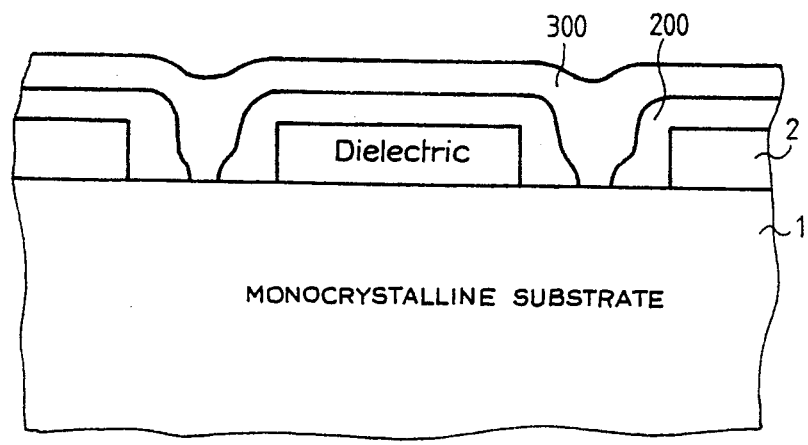
FIG_51
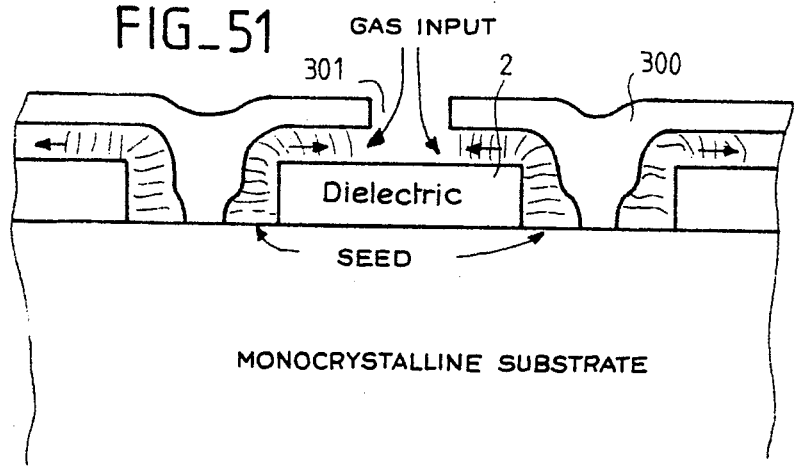

METHOD FOR THE FABRICATION OF AN ALTERNATION OF LAYERS OF MONOCRYSTALLINE SEMICONDUCTING MATERIAL AND LAYERS OF INSULATING MATERIAL

BACKGROUND OF THE INVENTION

1. Field of the Invention

The invention concerns a method for the fabrication of an alternation of layers of monocrystalline semiconducting material and layers of insulating material (or insulator), more particularly a method for making at least one thin layer of semiconducting material on a layer of insulator which is itself deposited on a layer of monocrystalline substrate.

An object of the invention is to obtain the three-dimensional integration of active electronic components. The invention thus enables the making, with a monocrystalline semiconductor substrate (monocrystalline silicon for example), of a stacking of thin layers of monocrystalline semiconductors, each layer being insulated from the previous one by a layer of insulator such as, for example, a layer of silica or dielectric appropriate in the case of layers of monocrystalline silicon.

2. Description of the Prior Art

Monocrystalline silicon on insulator (SOI) structures with only one level are known in the prior art. However, in these structures, there are no thermal limitations when making the single layer of silicon on insulator.

There are also known devices with several layers of monocrystalline silicon on insulator but, in this case, during the deposition and recrystallization of the semiconductor layer the underlying layer, which has already been made and processed, should not be thermally affected. This creates an additional constraint.

To make these layers of monocrystalline silicon on insulator, different techniques are available, such as:

(a) The technique using heteroepitaxy of silicon on sapphire (SOS or silicon on sapphire);

(b) The so-called SIMOX technique which consists in the buried formation of a layer of $SiO_2$ in monocrystalline silicon by implantation of oxygen in a very high dose.

(c) The so-called FIPOS technique which consists in the formation of $SiO_2$ buried by oxidation of porous silicon;

(d) Methods using the recrystallization of layers of amorphous or polycrystalline silicon either in solid phase or after melting (by lamp or by laser beams or by electron beams);

(e) The method using epitaxial lateral overgrowth (ELO) of silicon on insulator by chemical vapor deposition or vapor phase epitaxy (CVD or VPE).

The first three methods (a, b. and c) enable the making of devices in a structure with only one level of monocrystalline semiconductor, but do not enable the making of three-dimensional devices because excessive heat has to be applied to make the upper levels and/or to eliminate faults, and there is then the risk of damaging the devices in the underlying layers of monocrystalline semiconductor.

Of all these methods, it is the last two (d and e) which are, in principle, most suited to the integration of active 3D circuits, firstly because of the relative ease with which the formation of silicon layers of insulator can be repeated on several successive layers and, secondly, because of the thermal compatibility which potentially enables the formation of a monocrystalline layer without damaging the devices in the underlying layer. The exception here is, however, the method of melting by lamps, which is but little localized in comparison with methods using laser beams or electron beams.

However, recrystallization by melting with laser beams or by electron beams raises difficult problems related to the control of the excessive heating of the underlying layers wherein devices have already been made.

A general report on these techniques will be found in B. CHAPUIS et. al., "SOI Materials and Processing towards 3D Integration" published in *Proceedings of the Fourth Annual ESPRIT Conference*, September 1987, page 55.

The technique of epitaxy by chemical vapor deposition (CVD) is, in principle, more suited, from the thermal viewpoint, for the making of 3D structures, because the monocrystalline growth can be achieved at temperatures of as low as 850° to 900° C. A technique of this type is described in J. O. BORLAND and C. I. DROWLEY, "Advanced Dielectric Isolation through Selective Epitaxial Techniques" in *Solid State Technology*, August 1985, p. 141, as well as in L. KARAPIPERIS et al, "Selective Epitaxial Growth of Si and Insitu Deposition of Amorphous Poly-si for Recrystallization Purposes," *Proceedings of the 18th International Conference on Solid State Devices and Materials*, TOKYO 1986, p. 713.

The drawback of this technique of epitaxy by chemical vapor deposition lies in the difficulty of achieving lateral growth of thin layers of monocrystalline silicon on insulator. This difficulty is related to the impossibility of obtaining rates of lateral growth (parallel to the plane of the insulator) that are substantially greater than the rates of vertical growth perpendicular to the same plane.

The most advanced work has been done at the RCA firm by L. JASTRZEBSKI and his colleagues. The best results thus obtained consisted in continuous layers of monocrystalline silicon with nucleation bands of a width of 6 micrometers, repeated at every 12 micrometers. The initial thickness of the layer of monocrystalline silicon over $SiO_2$ was 6 micrometers, and this thickness was reduced to 0.6 micrometers by repeated oxidations repeated attacks. A technique of this type has been described in L. JASTRZEBSKI et al., "Preparation of Thin (0.6 micrometer) Continuous Monocrystalline Silicon over $SiO_2$", *Journal of the Electrochemical Society*, 132 (12), 1985, p. 3056. Besides, it would not be realistic to thin down thicker layers to the scale of a four-inch wafer. The difficulties and drawacks of the lateral epitaxy method (ELO) show that they are not applicable to the obtaining of bands of silicon on insulator compatible with the making of active components for integrated circuits, the necessary width of which should be at least 40 micrometers.

It is thus that, as shown in FIG. 1, a growth of monocrystalline silicon on a monocrystalline silicon substrate provided, on its main face, with zones of insulators (silica $SiO_2$) is achieved such that the vertical growth, perpendicular to the main face of the substrate, has a rate (vertical rate) which is substantially equal to the lateral rate corresponding to the lateral growth parallel to the main face of the substrate. A growth such as the one shown in dashes in FIG. 1 is obtained. It is then impossible to obtain a uniform, thin layer (of about 1 micron) of monocrystalline silicon covering the layer of silica on a wide area.

The invention concerns a method which can be used to obtain thin layers of monocrystalline semiconductor in bands with a width of more than 100 micrometers.

SUMMARY OF THE INVENTION

The invention concerns a method for the making, by crystal growth, through chemical vapor deposition, of at least one monocrystalline thin layer of a semiconducting material, wherein the growth is initiated on a seed of a monocrystalline material of the same type as the semiconducting material of the thin layer to be obtained, and is confined between two layers made of a material distinct from the semiconducting material in such a way that, in the deposition used, there can occur neither nucleation nor deposition of semiconducting material on the exposed surfaces of this or these distinct material or materials, the interval between the two layers of the distinct material or materials defining the thickness of the monocrystalline thin layer to be obtained.

The invention also concerns a method for making at least one layer of monocrystalline semiconducting material on a first layer of an insulating material made on a monocrystalline semiconducting substrate, said method comprising the following steps:

(a) A first step for making said first layer of insulating material on the monocrystalline semiconducting substrate, said first layer of insulating material having a chemical attack selectivity with respect to the adjacent layers and permitting neither nucleation nor deposition from the species of said chemical vapor deposition on its surface exposed to the chemical vapor deposition.

(b) A second step for the etching of first apertures in the first layer of insulating material;

(c) A third step for making a layer of a semiconducting material in the first apertures and on the parts of the insulating layer that remain after the previous etching step, said layer of semiconducting material being moncrystalline in the apertures and polycrystalline on the insulator;

(d) A fourth step for the making of a second layer of an insulating material on the layer of semiconducting material;

(e) A fifth step for the etching, in the second layer of insulating material, of at least one second aperture ending on a polycrystalline part of the layer of semiconducting material;

(f) A sixth step for the chemical attacking of the polycrystalline semiconducting material so as to eliminate all the polycrystalline semiconducting material and, possibly, so as to slightly attack the monocrystalline material;

(g) A seventh step for the selective growth, through a chemical vapor deposition process of a monocrystalline semiconductor material in the space or spaces left free by the disappearance of the polycrystalline material.

BRIEF DESCRIPTION OF THE DRAWINGS

The various objects and characteristics of the invention will appear more clearly in the following description, given by way of example, with reference to the appended figures, of which:

FIG. 20 shows the lateral growth and vertical growth of a monocrystalline material according to the method of the invention;

FIG. 21 shows a growth on a compound III-V semiconductor type monocrystalline substrate;

FIGS. 22 to 31 show an application of the method according to the invention to an embodiment on a type III-V semiconductor substrate;

FIG. 32 shows a step for the insulation of moncrystalline layers obtained according to the invention;

FIGS. 33 to 41 show different steps of a variant of the method according to the invention;

FIGS. 42 to 45 show another variant of the method according to the invention;

FIGS. 46 to 48 show a variant of the method according to the invention derived from the variant shown in FIGS. 42 to 45;

FIGS. 49 to 51 show another variant of the method according to the invention.

DETAILED DESCRIPTION OF THE INVENTION

Referring to FIGS. 2 to 13, we shall first describe an example of a fabrication method according to the invention.

Figure 1:
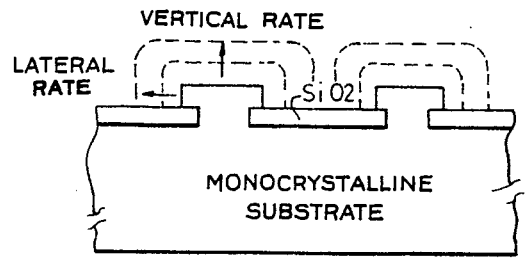
FIG. 1 shows an example of the making of a prior art structure.
Figure 2:
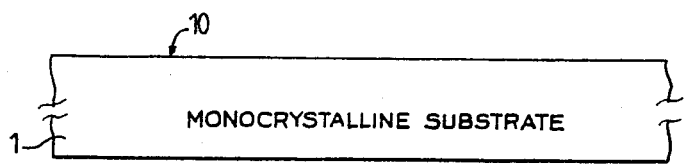
FIGS. 2 to 13, show different steps of an exemplary fabrication method according to the invention.

There is a substrate wafer 1 made of monocrystalline silicon with a crystallographic orientation (100) for example, as shown in FIG. 2. In the context of semiconductor circuit techniques, the substrate wafer 1 may have relatively large dimensions. For example, it may have a standard diameter of 4 inches or more.

Figure 3:
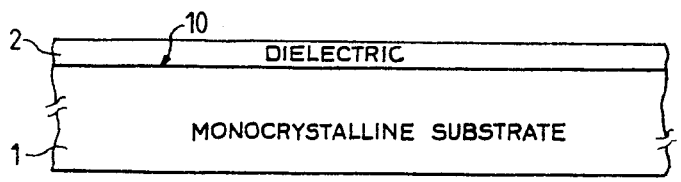

FIG. 3 shows the first step of a method according to the invention, during which a layer of insulator 2 is made on the face 10 of the substrate wafer 1. In the case of a silicon substrate, the layer of insulator is silica $SiO_2$ obtained either by deposition, or by oxidation of the surface of the substrate wafer 1. For example, the thickness of the insulator layer 2 ranges between 0.1 and 3 micrometers typically.

Figure 4:
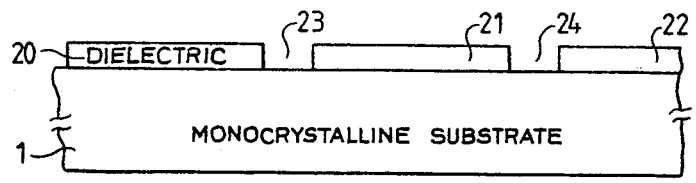

During a second step shown in FIG. 4, elements 20, 21, 22, of insulator are defined by etching the insulator layer 2.

These elements are insulator strips 20, 21, 22, separated by bands 23, 24, where the moncrystalline substrate is bared. These bands may have a width of 20 to 100 micrometers for example, separated by spaces of 1 to 20 micrometers. The etching of the insulator layer 2 can be done by any appropriate method such as photolithography or wet or dry chemical attack. The etching is such that, in the spaces 23, 24, the insulating material 2 is completely removed and the spaces 23, 24 comprise only the monocrystalline silicon of the substrate free of surface impurities.

Figure 5:
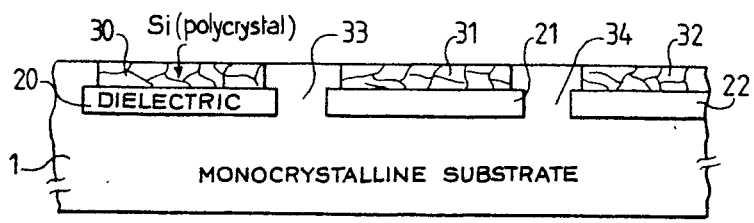

In a third step shown in FIG. 5, a layer of silicon is deposited on the preceding structure.

This deposition can be done by chemical vapor deposition (CVD). The silicon 33, 34, will then be monocrystalline with an orientation (100) on the monocrystalline substrate which will also have an orientation (100) located in the spaces 23, 24. On the contrary it will be polycrystalline 30, 31, 32, on the bands of insulator 20, 21, 22.

This deposition can be done by atmospheric pressure chemical vapor deposition (APCVD) with a mixture of silane (SiH$_4$) and hydrogen (H$_2$) at a temperature of about 950° C.

This deposition can also be done by reduced pressure chemical vapor deposition (RPCVD) using a mixture of dichlorosilane and hydrogen SiH$_2$Cl$_2$+H$_2$ at a temperature of about 850° C. This latter method of working is thermally more advantageous.

Furthermore, since the rate of growth in a direction perpendicular to the plane of the substrate is greater on the bands of monocrystal than on the silica, after a certain deposition time, (which will depend on the thickness of the silica bands) a deposit of a uniform thickness is obtained throughout the wafer. (This operation shall be called the "planarization" of the deposit.)

In order to obtain more efficient planarization, it is possible first of all, to fill in the spaces 23, 24, with monocrystalline silicon (100) in contact with the substrate, without making any deposition on the insulator bands 20, 21, 22, (conditions of selective deposition and epitaxy) and then to make a uniform deposition of silicon on the insulator bands 20, 21, 22, and the spaces 23, 24, previously filled with monocrystalline silicon. The selective filling of the spaces 23, 24 with monocrystalline silicon (100) is done either by atmospheric pressure chemical vapor deposition (APCVD) at a temperature ranging between 1000° and 1060° C., in using a gas mixture of SiH$_4$/HCl/H$_2$, or again by reduced pressure chemical vapor deposition (RPCVD) at a temperature ranging between 850° and 900° C. in using a gas mixture SiH$_2$Cl$_2$/HCl/H$_2$. (See articles by BORLAND, CHAPUIS and KARAPIPERIS already cited.)

This method of selective deposition relies on a mechanism of selective nucleation, by which the growth of the silicon is possible on surfaces with a low nucleation barrier (silicon (100) for example) while no nucleation takes place on the foreign surfaces such as silica for example. To obtain this selectivity, it is necessary to work under conditions of very slight super-saturation and in using appropriate gas mixtures.

Figure 6:
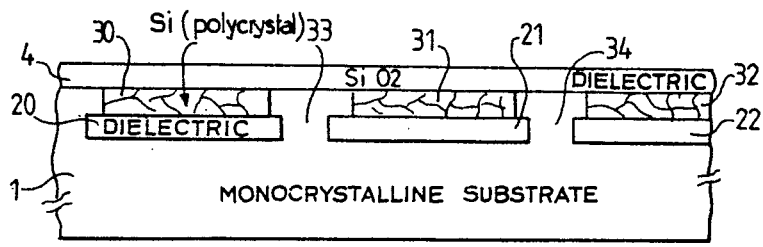

During a fourth step, shown in FIG. 6, a layer of insulator 4 is made on the structure thus obtained. This insulator may be, for example, silica (SiO$_2$) if the material used in the preceding operation is silicon. This layer of silica can be formed either by thermal oxidation or by deposition or by a combined approach of the type combining thermal oxidation and deposition. For the deposition, it will be preferred to use a high temperature method (HTO); for example, a pyrolysis of SiH$_2$Cl$_2$ and N$_2$O at 850°-900° C. so as to obtain good quality silica. The thickness of this layer of silica will range, for example, between 0.5 and 3 micrometers.

Figure 7:
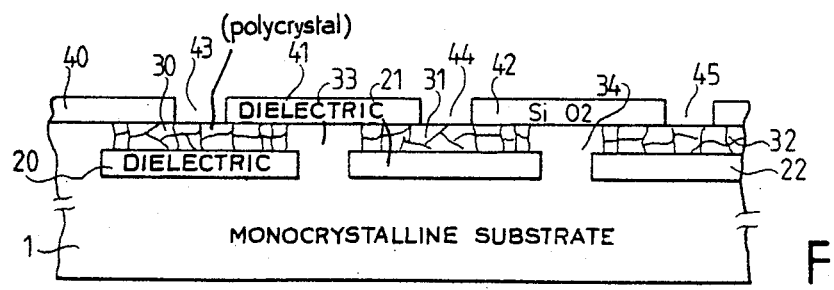

During a fifth step, shown in FIG. 7, apertures 43, 44, 45, are made in the insulator layer 4. These apertures 43, 44, 45 are located over zones of polycrystalline material 30, 31, 32. By the application of the above exemplary method of fabrication, where the insulating elements 20, 21, 22, are in the form of bands, the apertures 43, 44, 45, are also made in the form of bands with a width substantially smaller than the width of the insulator bands 20, 21, 22. Thus, for example, with the insulator bands 20, 21, 22, having a width of 20 to 100 micrometers, the width of the apertures 43, 44, 45, could range between 1 and 20 micrometers. In these apertures, 43, 44, 45, the insulator is completely removed, revealing bands of polycrystalline silicon located substantially and preferably at the center of the zones made of polycrystalline material, 30, 31, 32.

Figure 8:
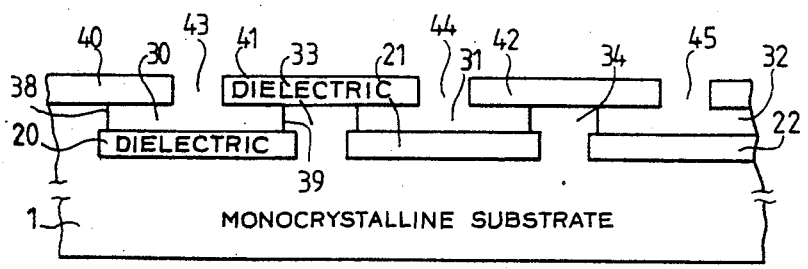

During a sixth step shown in FIG. 8, the polycrystalline silicon 30, 31, 32, is removed by chemical attack in using the apertures 43, 44, 45, made in the layer of insulator. The attacking process is stopped when the monocrystalline silicon of the parts 33 and 34 is bared.

This sixth attacking step can be completed by a cleaning stage so as to remove all possibly remaining impurities or imperfections.

Figure 9:
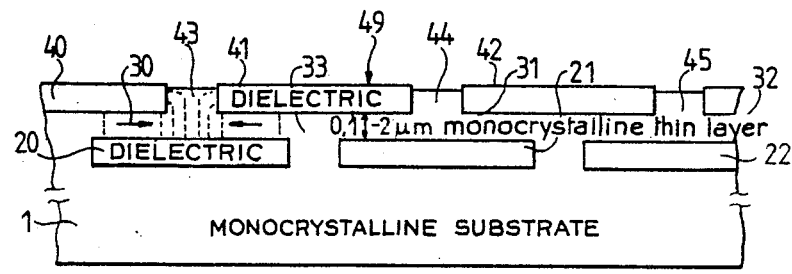

During a seventh step shown in FIG. 9, a strip of monocrystalline silicon is made to grow laterally under conditions of selective epitaxy (conditions described earlier), using the previously bared monocrystalline silicon seeds (38 and 39). The operating conditions for this growth are similar to those of the second part of the third step as described earlier. The monocrystalline growth can take place only laterally and not vertically, because it is channelled in each cavity (30, 31, 32) by the top insulator (silica layers 40, 41, 42) and the underlying silica bands (20, 21, 22). When the silicon strip starts going beyond the silica tops in the apertures 43, 44, 45, the growth takes place also perpendicularly to the plane of the substrate as shown by dashes in FIG. 9. Thus the various gaps, left empty after the attacking of the polycrystalline silicon, are filled.

For certain applications, it is possible to consider filling the space beneath the insulator top only up to the edge without going beyond, and without making the two edges of monocrystalline silicon, going forward in opposite directions, join up.

If the apertures 43, 44, 45, between the upper silica bands 40, 41, 42, are too wide, the two crystallization fronts will join up only at the cost of having a vertical growth which will also be excessive (see FIG. 20). It then becomes difficult to "planarize" the structure by simple methods. To overcome this drawback, it is possible to introduce a certain number of additional steps which shall be described further below in an alternative fabrication method of the invention.

Figure 10:
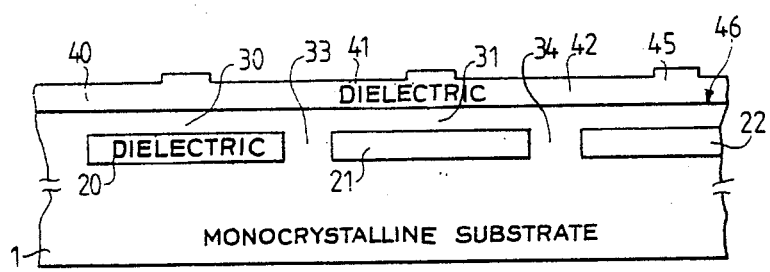

During an eighth step shown in FIG. 10, the deposit of monocrystalline silicon that has just been deposited is oxidized. This oxidation practically affects only the monocrystalline silicon located in the apertures 43, 44, 45. This oxidation is done in depth so that the lower faces of oxidized silicon in the bands 43, 44 and 45 are flush with the lower faces of the layers 40, 41, 42. We thus obtain, as shown in FIG. 10, a face 46, which is substantially continuous and planar.

Furthermore, depending on the height of monocrystalline silicon obtained during the seventh step, in the apertures 43, 44, 45, the upper face of oxidized silicon is not necessarily planar and may, for example, as shown in FIG. 10, have projections of oxidized silicon at the apertures 43, 44, 45. However, these uneven features of the surface do not affect the quality of the component which shall be obtained subsequently in the method, since the layer of oxidized silicon will be eliminated.

Figure 11:
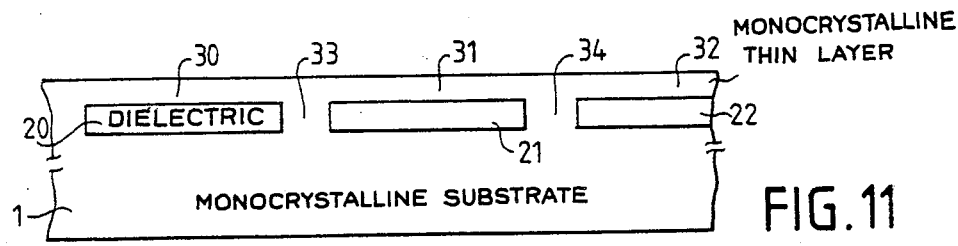

During a ninth step shown in FIG. 11, the silica is removed throughout the surface of the wafer so as to obtain a uniform layer of monocrystalline silicon (30, 31, 32). The thickness of this layer of monocrystalline silicon may typically be 0.1 to 2 micrometers on the silica bands 20, 21, 22 (with a width of 20 to 100 micrometers). It is thus possible to make silicon on insulator (SOI) components on each silica band.

The SOI silicon bands can be insulated in two ways in a tenth step.

During a tenth step, therefore, monocrystalline silicon bands 30, 31, 32, each corresponding to an insulator band 20, 21, 22, are insulated from one another.

Figure 12:
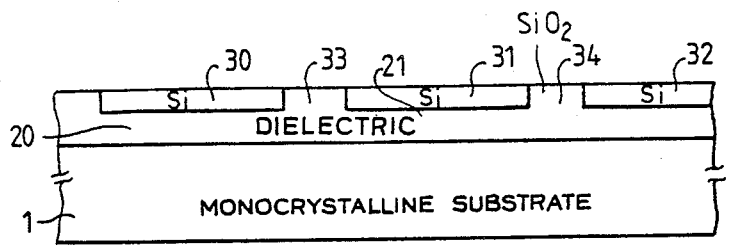

According to the example of FIG. 12, the silicon located on top of the above apertures 33, 34, as well as of the silicon located in these apertures is oxidized.

We thus obtain monocrystalline silicon bands 30, 31, 32, which are insulated from one another, as well as from the substrate 1, by silica.

Figure 13:
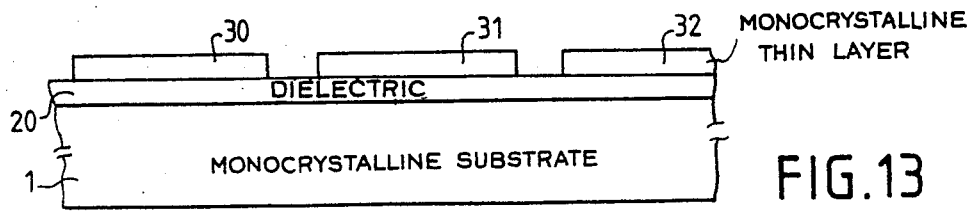

According to the example of FIG. 13, to make bands of monocrystalline silicon, the localized oxidation achieved in FIG. 12 is completed by chemical etching or dry etching of the silica bands made. As shown in FIG. 13, we thus obtain bands of monocrystalline silicon 30, 31, 32, which are distinct from one another and insulated from the substrate 1 by a layer of silica; or else, in one variant, starting from the situation of FIG. 11, the silicon is etched on the bands 33, 34, and this is done up to half of the thickness of the insulator bands made of silicon, and then the silicon in these bands is oxidized locally so as to obtain a continuous band of silica.

Figure 14:
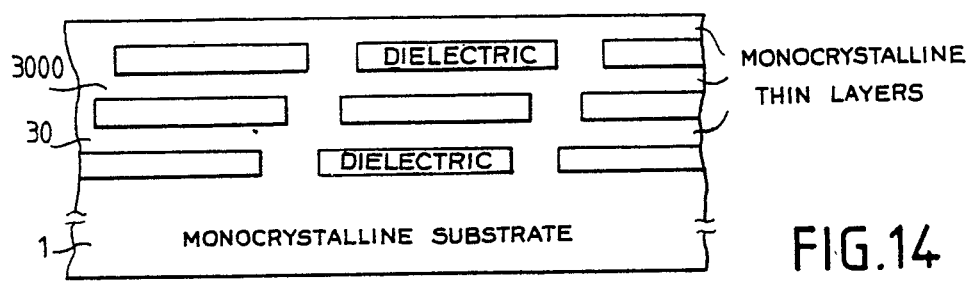
FIG. 14 shows an example of the making of alternate layers of monocrystalline silicon and insulator on a monocrystalline substrate.

According to the exemplary embodiment shown in FIG. 14, it is possible, by repeating the above-described method, to make, on the structure of FIG. 11, a second and a third similar structure and so on. It is thus possible to obtain an alternation of layers of monocrystalline silicon and insulator (silica). A system of silicon bands on insulator can thus be made, the seeding zones being superimposed or offset.

In making active components on the initial substrate and, successively, on each silicon layer, a three-dimensional integrated circuit is obtained. Because of the relatively low temperature used in the CVD method, a layer of Si is prepared without any deterioration of the underlying layer which has already been made and includes active components.

The sequence of the preceding steps has been described on the basis of a dielectric which was made of silica. This dielectric can be replaced by any other polycrystalline or amorphous insulating material ($Si_3N_4$, $Al_2O_3$ etc.), it being understood the above-described selective deposition and epitaxy conditions can be obtained, or by a combination of several of these materials (for example silica for the layer 2 and silicon nitride for the layer 4).

According to a variant of the method of the invention, and if the apertures 43, 44 and 45 obtained at the end of the fifth step in the layer 4 of insulator (FIG. 7) are too wide, the growth of the silicon, when the monocrystalline strip escapes the constraint of the insulator top, will take place also vertically, and the two crystallization fronts will take join up only at the cost of an excessive vertical growth in the apertures 43, 44, 45. This excessive vertical growth will make the subsequent "planarization" of the deposit difficult (see FIG. 20). For, if the gas flow enabling epitaxy by CVD is to easily penetrate a cavity such as 30 of FIG. 8, the aperture 43 should be in keeping with the dimensions of this cavity. Furthermore, the thickness of the layer 4 of insulator is relatively small (0.2 to 5 micrometers). The overhanging of the end of the insulator bands 40, 41, 42, should not be excessive, otherwise there is a risk that these bands will get deformed under their own weight and, then, monocrystalline silicon layers of uniform thickness will not be obtained. This therefore limits the potential, lateral extension of the crystal. To overcome these various drawbacks, it might become necessary to make relatively large apertures 43, 44, 45, during the fifth step.

However, as we have seen, the width of the apertures 43, 44, 45, results in vertical growth fronts which cause surface inequalities in the apertures 43, 44, 45, after deposition (see FIG. 20). To prevent these inequalities without thereby limiting the lateral extension of the crystal in any way, the invention proposes variants of fabrication methods.

According to a first variant, during the above described seventh step, the growth of silicon will be allowed to run over after going beyond the silica bands 40, 41, and 42, and a mechanical/chemical polishing operation will be done after the crystallization fronts join up (this joining up is obtained at the cost of considerable local vertical growth as shown in FIG. 20). The polishing operation will stop when the upper plane of the silica has been reached, by the selectivity of the reagent (colloidal silica in particular) used in this operation.

Figure 15:
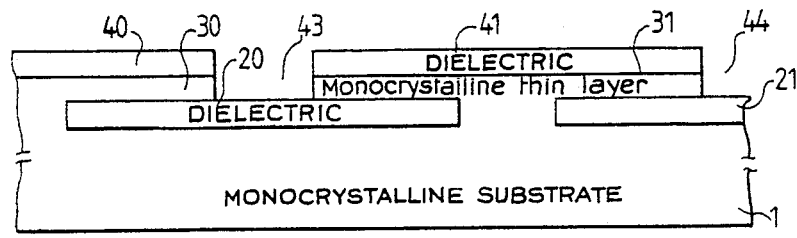
FIGS. 15 to 19 show the steps of an improvement of the fabrication method according to the invention.

According to a second variant, during the above-described seventh step, the deposition of silicon will be stopped when the growth reaches the flanks of the apertures 43, 44. Thus, a structure such as the one shown in FIG. 15 is obtained.

Figure 16:
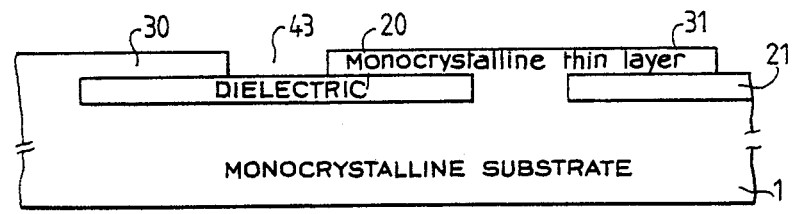

During a first ancillary stage, shown in FIG. 16, the upper layers 40, 41 of silica are then removed, in masking the lower layers 20, 21 beforehand.

Figure 17:
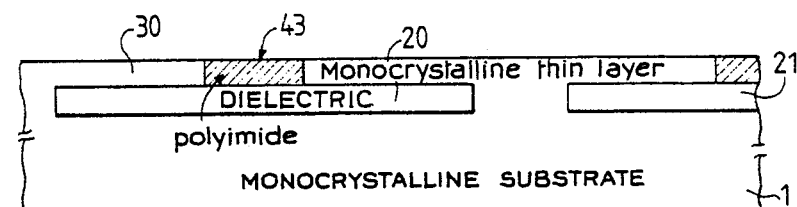

During a second ancillary stage, shown in FIG. 17, and after removal of the masking product from the silica 20, 21, the structure is "planarized" by means of a polyimide type deposition done with a spinner (photosensitive resin depositing machine) for example, using an "etch back" step if need be.

Figure 18:
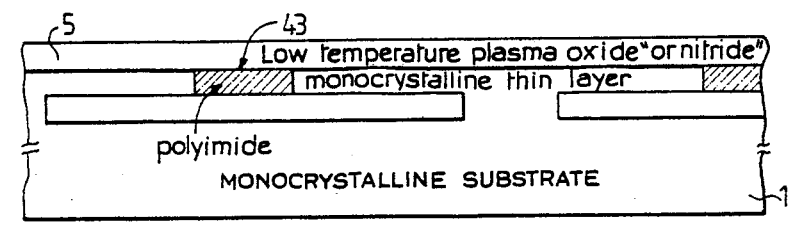

During a third ancillary stage, shown in FIG. 18, a layer of oxide ($SiO_2$) 5 or nitride ($Si_3N_4$) is deposited, at low temperature (LTO), by pyrolysis of $SiH_4 + N_2$ plasma-assisted at 250° C. (for example), on the previously planarized structure.

Figure 19:
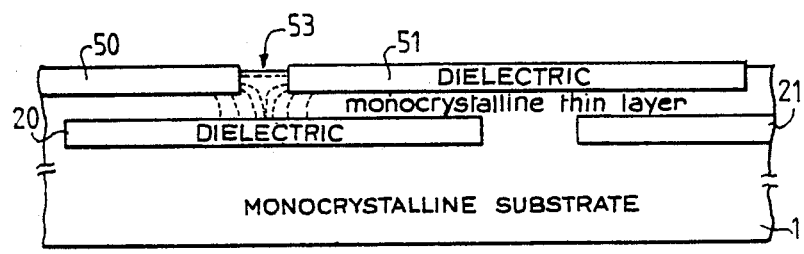

During a fourth ancillary stage, apertures 53 are cut out in this latter layer of silica or nitride 5 so as to return to a structure identical to the one obtained in the description of the foregoing fifth step. The aperture in the silica is now compatible with accurate filling (without vertical overrun to obtain the meeting of the two crystallization fronts) of the empty bands between the silica bands. During a fifth ancillary stage, the polyimide is dissolved by means of an appropriate solvent, and the lateral growth operation described for the seventh step is repeated as shown in FIG. 19. We are thus brought back to the case of FIG. 9 from which it is possible to repeat the above-described step 8 and the ones that follow it. This series of ancillary steps possibly may be reproduced several times if necessary.

The method of the invention can thus be used to make a thin layer of a monocrystalline semiconducting material in achieving a growth, under chemical vapor deposition of this semiconducting material, between two layers (20, 40, 41) of a material (see FIG. 8) which is different from the semiconductor and on which neither the nucleation nor the deposition of the semiconducting material in question is observed during the growth. The layers 20, 40, 41, define an empty volume 30, the thickness of which defines the thickness of the layer of semiconducting material to be obtained.

The ends 38, 39 (FIG. 8) of the volume 30 are made up of semiconducting material identical to the semiconducting material used for the growth. The semiconducting material at the ends 38, 39, thus acts as seeds for the lateral growth of the thin layer of monocrystalline semiconducting material.

In the foregoing description, the application of the invention to a silicon based structure has been given only by way of example. The invention can also be applied, in general, to a structure based on any type of semiconductor, provided that the deposition selectivity between a foreign surface (not necessarily dielectric) and the surface of the semiconductor can be achieved. Thus, the invention can be applied to III–V compounds of the GaAs, InP type etc. provided that particular technological arrangements are made. The problem is to obtain conditions of selective deposition.

Regarding the III–V compounds, and GaAs in particular, in order to obtain this deposition selectivity, preference will be given to a method that enables the achieving of a state close to thermodynamic equilibrium in conditions of slight super-saturation. Thus the method of chemical vapor deposition epitaxy or vapor phase epitaxy (VPE) using chlorides enables operation in conditions of this type. The method uses, firstly, $AsCl_3$ diluted in $H_2$ as gas sources and, secondly, Ga as a solid source. The operation is done in an oven where the temperature of the Ga source is, for example, of the order of 800° C. while the sample on which the work is done is kept at a lower temperature, of the order of 650°–700° C., thus giving the announced condition of slight super-saturation.

As regards InP, the operation is done with a gas source $PH_3$ and HCl in $H_2$ and a solid source In. The sample is placed under temperature of around 700° C. and the In source is heated to a greater temperature, as above.

In using the above-mentioned parameters, selective nucleation is obtained on the exposed crystalline parts of the substrate (surfaces with low nucleation barriers). Subsequently, a deposition is observed on these same exposed parts and no deposition on foreign surfaces with higher nucleation barrier (dielectric surfaces for example, but also metallic surfaces such as tungsten surfaces).

Examples of this deposition selectivity between GaAs and $SiO_2$ and InP and $SiO_2$ can be found by way of indication in a recent article by M. ERMAN et al. in SPIE, Vol. 651, *Integrated Optical Circuit Engineering III*, (1986), p. 75.

Depending on the conditions of orientation of the bands opened in the deposited silica and depending on the mole fraction of $AsCl_3$ in the gas mixture, different facet structures are obtained for the monocrystalline deposit (see for example, article by N. VODJANI et al. in *Journal of Crystal Growth* 71, 1985, p. 141.

We have cited GaAs and InP by way of example, but it is possible to selectively deposit ternary or quaternary alloys (GaInAsP) in using gas sources As $H_3$, $PH_3$ and HCl in $H_2$ and solid sources Ga and In, again in setting up a state close to thermodynamic equilibrium in conditions of slight super-saturation.

If (again with respect to III–V compounds) we use a deposition method that works at atmospheric pressure and under conditions that are very far from thermodynamic equilibrium, such as MOCVD (metal organic chemical vapor deposition) for example, monocrystalline semiconducting material 34 is deposited on the exposed nucleation surfaces of the substrate 1 and polycrystalline material 30, 31, is deposited on the (dielectric or metallic) foreign surfaces 20, 21 as shown in FIG. 5 (see, for example, R. AZOULAY et al, *Journal of Crystal Growth*, 55, 1981, p. 229).

In this MOCVD method, the compound III source is metal organic (trimethylgallium, triethylgallium, trimethylindium, triethylindium etc.) while the compound V source is a hydride ($AsH_3$, $PH_3$). It must be stated all the same that, under certain conditions and, again, in working under atmospheric pressure, a certain selectivity can be obtained by working with silica or tungsten bands with a width of less than 40 micrometers. However, this procedure is restrictive and difficult to use (see K. YAMAGUCHI et al., *Japanese Journal of Applied Physics*, vol. 24, No. 12, 1985, p. 1666).

On the contrary, in working at reduced pressure (10 mm. on Hg column) and again in using the MOCVD method, K. KAMON et al. (Journal of Crystal Growth, 73.198573) have recently demonstrated that excellent deposition selectivity can also be obtained between a (100) exposed GaAs surface and a silicon nitride film ($SiN_x$) deposited by plasma-assisted CVD at 250° C.; Although the method used (MOCVD) is outside thermodynamic equilibrium, selectivity is obtained owing to a greater surface diffusivity, on the dielectric surfaces, of the products of decomposition of trimethylgallium (or trimethylindium) under the reduced pressure conditions used.

Finally, it should be noted that, by using the technique of molecular beam epitaxy (MBE) using metal organic compounds of gallium or indium (trimethylgallium or triethylindium, etc.), the same deposition selectivity is also obtained although it is very far from thermodynamic equilibrium. This is probably due to the same reasons of increased surface diffusivity on the dielectrical surfaces when the surrounding pressure is low (see for example, E. TOKUMITSU et al. *Journal of Applied Physics*, 55, 1984, p. 3163).

In short, the selective epitaxy of various III–V compounds (GaAs, InP, Ga In As, Ga In As P, etc) can be controlled by several distinct techniques, namely:

1. Vapor phase epitaxy (VPE) by the chlorides method;
2. Low pressure metal organic chemical vapor deposition (LP.MOCVD);
3. Metal organic molecular beam epitaxy (MOMBE).

Furthermore, the atmospheric pressure MOCVD method enables the deposition of continuous polycrystalline layers on the dielectric and monocrystalline surfaces on the exposed surfaces of a substrate which is also monocrystalline.

If this summary is kept in mind, it is seen that it is possible first of all to perform, by homoepitaxy (or heteroepitaxy of a compound having the same lattice parameter), stacks of monocrystalline III–V layers insulated by dielectric layers. One way to achieve this stacking is described hereinafter.

To implement the method of the invention for III–V semiconductor compounds, the different steps described below shall be performed:

Step 1: We start with a standard wafer 1 made of GaAs or InP with a diameter of 2 or 3 inches and an orientation (100) or (110). (FIG. 22).

Step 2: Using means known to those skilled in the art (cathode sputtering, vacuum evaporation, CVD, plasma CVD etc.) a thin layer 2 of a dielectric material is deposited. This material may, for example, be silicon nitride $Si_3N_4$, silica $SiO_2$, oxides such as $Al_2O_3$ etc., or fluorides such as $CaF_2$ etc. The thickness of this deposit ranges typically between $5 \times 10^{-2}$ and a few micrometers. Then, using means known to those skilled in the art, a set of bands 23, 24, is etched on this dielectric, said bands having a width of 0.5 to a few microns and being spaced out at distances of some microns to several hundreds of microns, thus periodically baring the monocrystalline substrate (FIGS. 23 and 24).

The orientation of the bared substrate bands 23 and 24 shall be done in such a way that, in view of the subsequently used selective deposition conditions (for example mole fraction of $AsCl_3$ in VPE), the facet of lateral growth is not restrictive. Thus, if a GaAs substrate with an orientation (110) is used, the bands will be oriented between 0° and 40° of the direction (110): this corresponds to high rates of lateral growth (see, for example, the article by C. O. BOZLER et al. in *Journal of Vacuum Science and Technology* 20, March 1982, p. 720.).

Step 3: Using, for example, atmospheric pressure MOCVD or else by standard MBE, a thin layer of III–V compound, with a lattice matched with the substrate, is deposited on the preceding structure. This layer will be monocrystalline at the exposed places of the substrate and polycrystalline on the dielectric. The thickness of this layer will be a few hundred angstroms to a few microns. The planarization is obtained either naturally (the growth rate is greater on the monocrystalline parts than on the dielectric) or, if the dielectric thickness is great, by making a prior selective deposition through, for example, reduced pressure MOCVD, the effect of which is to fill the apertures made in the dielectric with monocrystalline material without any deposition being observed on this very same dielectric (FIG. 25).

Step 4: A second layer of dielectric, with a thickness ranging from a few hundred angstroms to a few micrometers, is re-deposited on the above planarized structure (FIG. 26).

Step 5: Just as above, apertures are etched in this second layer of dielectric. These apertures are offset with respect to the previous ones, and this offset can vary from some micrometers to some hundreds of micrometers (FIG. 27). These apertures are located in the central part of the polycrystalline material.

Step 6: Through these apertures, the III–V polycrystalline material is removed by chemical attack so as to bare the monocrystalline seed (FIG. 28).

Step 7: Using the previously bared seed and under selective epitaxy conditions VPE, L.P.MOCVD or MOMBE), a strip of III–V material, which will extend laterally on either side of the seed, is made to grow. We thus obtain a thin layer of monocrystalline III–V material between two layers of dielectric (FIG. 29).

The apertures in the upper dielectric can thus be completely filled (provided however, that their width is compatible with this operation) so that the two crystallization fronts coming from two adjacent join up.

Step 8: The previous deposition is planarized (at the apertures 43, 44, 45), for example by selective attack in a plasma based on $CF_4$ or $CF_4+He$ etc., so as to obtain a substantially planar upper surface of the monocrystalline deposit (FIG. 30).

Step 9: The upper dielectric is removed throughout the surface of the wafer so as to obtain a monocrystalline thin layer of semiconductor, insulated from the substrate by bands of lower dielectric and communicating with this same substrate through monocrystalline wells (FIG. 31).

Step 10: The thin layer 30, 31, 32, can be completely insulated by locally etching this layer in zones 38, 39, so as to separate the thin layer 30, 31, 32, from the monocrystalline wells 33, 34, communicating with the substrate as shown in FIG. 32.

All the previously described steps 3 to 8 can be repeated from foregoing step 9 onwards, to obtain a stacking such as the one shown in FIG. 14.

Just as above, when the width of the bands 43, 44 and 45, opened in the upper dielectric, is excessive, the growth will run over the upper plane of the dielectric as shown in FIG. 20. Hence, to overcome this drawback, a variant is introduced which is the same as the one shown in FIGS. 15 to 19.

Furthermore, it is possible to find variants to the exemplary fabrication method shown in FIGS. 22 to 32.

Thus, a first variant of the method described according to the steps 1 to 7 is commented upon below, with reference to FIGS. 33 to 41.

Step 11: As above, we start with a substrate of III–V compound, GaAs or InP, shown in FIG. 33.

Step 12: Bands 70, 73, metallic (Au, Pt, etc.) for example, or else organic (resin, polymer, PMMA, polyamide) are deposited and etched. These bands will serve essentially as etching masks for the following step. The width of these bands is 0.5 to a few microns and they are spaced out at distances of a few microns to a few hundreds of microns. A structure of this type is shown in FIG. 34.

Step 13: In the substrate 1, using the previously deposited bands 70, 73 as a mask, a system of mesas is etched, also in bands. The characteristic dimensions are, of course, the same as above, namely 0.5 to a few microns for the width of the bands of mesas and a few microns to a few hundreds of microns for the spacing between the bands of mesas. The etching depth is typically a few hundred angstroms to a few microns (FIG. 35).

Step 14: Using means known to those skilled in the art, a dielectric 90 to 93 ($SiO_2$, $Si_3N_4$ etc.) is deposited on the previous structure. The thickness of this dielectric will also be a few hundred angstroms to a few micrometers but, in any case, it will be smaller than the depth of the etching made during the step 13 (FIG. 36).

Step 15: As shown in FIG. 37, the layers of dielectric 90, 93 on the mesas (and only on the mesas) are removed by lift-off method in attacking the metallic bands or resin bands deposited during the step 12.

Step 16: the foregoing structure is planarized by means of a typical polyimide material 101, 102, deposited with a spinner (FIG. 38).

Step 17: A dielectric layer 110 is deposited at low temperature, by means known to those skilled in the art. This dielectric layer 110 has a thickness of a hundred angstroms to a few microns (FIG. 39).

Step 18: Apertures 43, 44, (in the form of bands) are etched in the above dielectric: these apertures are offset with respect to the mesas and placed in the central part of the recess sheltering the polyimide. The polyimide is removed by being dissolved with an appropriate solvent. The effect of this operation is to bare the monocrystalline seed on the lateral flanks of the mesas. Thus a structure such as the one shown in FIG. 40 is obtained.

Step 19: Just as above (step 7), the thin layer (of III–V compound for example) is made to grow under conditions of selective deposition and epitaxy (VPE, LP.MOCVD, MOMBE), using seeds formed by the flanks of the mesas as shown in FIG. 41.

It is possible, as above, when the apertures (43, 44) in the second dielectric layer are too wide, to use the method described with reference FIGS. 15 to 19, in order to prevent the overrunning, in the upper plane of the dielectric, of the layer which is in the process of growth. In all cases, a situation is reached similar to the one shown in FIG. 29: this subsequently enables the steps shown in FIGS. 30, 31, 32 and 14, as described above, to be performed.

During the step 3 (shown in FIG. 5 of the above-described method, there is provision for a deposition of monocrystalline semiconducting material on the nucleation zones 23 and 24 and polycrystalline semiconducting material on the dielectric zones 20, 21, 22. For various reasons, it may be desirable to separate the two parts of this simultaneous deposition. Different ways of achieving this separation are proposed below.

According to a first version, the step of depositing a first dielectric 2, described above (step 1 of the general method), is done with initial substrates of either Si or GaAs or InP, etc. with a suitable orientation, for example (100). The etching step 2 is not performed.

Step A-3: A second layer 200, of a material which is not necessarily dielectric, is deposited: however, this second layer 200 has a different nature from that of the material deposited during the step 1 (for example, if the layer deposited during the step 1 is made of silica, the layer deposited during this step 3 could be in silicon nitride $Si_3N_4$) or else tungsten W or else any other material capable of having selectivity of chemical attack with respect to the layer deposited during the step 1, in this case silica). The thickness of this second layer will be of the same order of magnitude as the first one. Thus, the structure shown in FIG. 42 is obtained.

On the basis of this situation, four sub-variants can be envisaged.

A first sub-variant specifically concerns a silicon substrate 1.

Step A-4-1: a layer of silica $SiO_2$ with a thickness of a hundred angstroms to a few microns is deposited.

Step A-5-1: An etching is done, in the multilayer structure obtained above, of a set of bands 301 with a width of 0.5 to a few micrometers and spaced out by a few micrometers to a few hundreds of micrometers. These bands periodically bare the monocrystalline substrate as shown in FIG. 43.

Step A-6-1: Through selective CVD deposition of silicon up to the level of the middle of the upper layer of silica, the apertures 301 obtained above are filled, and this is done by using selective epitaxy conditions as described above (see FIG. 44).

Step A-7-1: The silicon deposited during the previous step is oxidized so as to "planarize" the structure (see FIG. 45).

Step A-8-1: Apertures are etched in the upper silica: these apertures are offset with respect to the previous ones so as to obtain a structure similar to the one obtained during the fifth step of the main method described previously and shown in FIG. 7.

From then on, the preceding sixth step is repeated by dissolving the layer 200 through selective chemical attack so as to bare the monocrystalline silicon seeds. Then the seventh step of lateral growth, described earlier, is repeated, so as to obtain a structure similar to that of FIG. 9. Then the steps corresponding to FIGS. 10 and 14 are easily performed.

According to a second sub-variant, the following steps are performed:

Step A-4-2: In the sandwich structure shown in FIG. 42, a set of bands is etched just as in the previous step A-5-1. A structure of the type shown in FIG. 46 is obtained.

Step A-5-2: the bands obtained in the previous step are filled by selective epitaxy of the desired semiconductor (Si, GaAs, InP etc.) so as to planarize the structure.

Step A-6-2: On the preceding structure, a uniform layer 4 is deposited. This layer 4 may or may not be made of a dielectric materal, but has the following characteristics:

it enables the selective attacking of the layer No. 2.

It enables the selective deposition of the desired semiconducting material, i.e. it has, in principle, with respect to the "parent" gas phase, a higher nucleation barrier than the seeds of monocrystalline semiconducting material obtained during the step A-5-2.

The structure obtained is shown in FIG. 45, where the substrate is any monocrystalline semiconductor and where the upper silica layer 4 is replaced by a layer of material, the characteristics of which have been stated above. From this step onwards, the fifth (the opening of type 43, 44, 45 bands), sixth (dissolving of the layer 200), seventh (forced lateral growth under conditions of selective epitaxy) steps and the following ones of the main method are repeated so as to obtain thin layers and stacking of insulated thin layers as shown, for example, in FIGS. 31, 32 and 44.

According to a third sub-varient, for various reasons of planarity and optimum surface roughness, it may be useful to deposit amorphous silicon as the layer 200 during the step A-3, especially if the monocrystalline substrate is capable of supporting high temperatures (oxidation temperatures of Si). After this deposition, an oxidation of the upper part of the amorphous silicon is done so as to obtain, after etching of bands, a structure similar to the one shown in FIG. 7.

It will be noted in this FIG. 47 that the amorphous silicon structure has been slightly undercut.

During the oxidation operation (typically at 1000° C.) of the layer of amorphous silicon (typically deposited at 450° C.), this layer of amorphous silicon recrystallizes, to give polycrystalline silicon, while the $Si/SiO_2$ interface nonetheless retains very low surface roughness.

Thus, during the operation for the selective filling of the nucleation bands (step A-6-1 or Step A-5-2), in order to prevent any unwanted and troublesome lateral growth from the amorphous silicon seeds converted into polycrystalline, it is preferred to slightly undercut the amorphous silicon layer 200 converted into polycrystalline. In this way, the vertical growth in the nucleation bands is not hampered by lateral outgrowths from polycrystalline seeds, it being understood that the undercutting is performed in such a way that the vertical growth front reaches the $Si/SiO_2$ interface of the layer 300 before the lateral growth front coming from the polycrystalline seeds have joined the side walls of the nucleation bands.

After the nucleation bands have been selectively filled with monocrystalline material, the steps A-7-1 etc. described above are repeated if the desired semiconducting material is silicon.

The fourth sub-varient extends the previous one to any other semiconductor except silicon, with the use of silicon or another amorphous semiconductor as the layer 200.

On the structure of FIG. 42 (where the layer 200 is made of silicon or amorphous semiconductor), a layer 300 of material which, firstly, has excellent attacking selectivity with respect to silicon or any other amorphous semiconductor and, secondly, enables the selective deposition of the desired semiconducting material, i.e. having in principle, a higher barrier of nucleation than the surface or main crystallographic planes of the semiconducting substrate 1. Then, nucleation bands are etched to obtain a structure similar to that of FIG. 47, wherein the silicon or amorphous semiconductor will have also been undercut.

The semiconducting material, with a different nature from that of the substrate, is deposited in the nucleation bands by selective epitaxy, so that it only very partially fills the corresponding part of the layer 300. A similar structure is shown in FIG. 4. A passivation layer 500 is re-deposited on the unit. This passivation layer may be made of a material such as that of the layer 300 or else of any other material enabling conditions of surface non-nucleation to be obtained. Finally, bands are opened in the material of the layer 500 (as during the fifth step of the general method), so that they are offset with respect to the nucleation band (FIG. 48).

From here onwards, it is possible, as described above, to perform the operations for chemical dissolving of the silicon or the amorphous semiconductor (layer 200) and for the lateral growth of the monocrystalline semiconductor, which may or may not have a different nature from that of the substrate, using bared seeds (sixth and seventh steps of the general method).

Another version starts with the first and second steps of the general method. Then, the following steps are performed:

Step B-3: A uniform layer 200 of a material is deposited: it has excellent chemical attacking selectivity with respect to the dielectric, on the one hand, and with respect to the layer 300 (the description of which follows), on the other hand. This layer 200 may be amorphous silicon, a dielectric, a metal or else polyimide or an equivalent material.

Step B-4: A system of bands is etched in the preceding layer so as to bare the substrate in the spaces left free by the etching of the first system of bands. The situation is shown in FIG. 49.

It has been seen to it that the apertures made in the layers 200 have a width smaller than that of the former ones, and that they are symmetrically arranged in the middle of these former ones.

Step B-5: A uniform layer 300 is re-deposited on the preceding structure. This layer 300 is made of a material having excellent chemical attacking selectivity with the material 200 and having, in addition, with respect to the "parent" gas phase, a nucleation barrier which is higher than the main crystallographic planes of the substrate. The situation is shown schematically in FIG. 50.

Starting from this situation, the fifth step of the general method is repeated. The layer 200 is dissolved according to the sixth step of the general method and, under conditions of selective epitaxy, using the seed formed by the upper face of the substrate, a thin layer of the desired material is again made to grow according to the seventh step of this very same general method (see FIG. 51).

It is quite clear that the above description has been given purely by way of a non-restrictive example. Other variants may be contemplated without going beyond the scope of the invention. The numerical values and the types of semiconducting materials have been given solely in order to illustrate the description.

WHAT IS CLAIMED IS:

1. A method for the fabrication of at least one layer of monocrystalline semiconducting material on a first layer of an insulating material made on a monocrystalline semiconducting substrate, said method comprising the following steps:
    (a) A first step for making said first layer of insulating material on the monocrystalline semiconducting substrate, said first layer of insulating material having a chemical attack selectivity with respect to the adjacent layers and permitting neither nucleation nor deposition from the species of said vapor phase on its surface exposed to the vapor phase.
    (b) A second step for the etching of first apertures in the first layer of insulating material;
    (c) A third step for making a layer of a semiconducting material in the first apertures and on the parts of the insulating layer that remain after the previous etching step, said layer of semiconducting material being monocrystalline in the apertures and polycrystalline on the insulator;
    (d) A fourth step for the making of a second layer of an insulating material on the layer of semiconducting material;
    (e) A fifth step of etching, in the second layer of insulating material, of at least one second aperture ending on a polycrystalline part of the layer of semiconducting material;
    (f) A sixth step for the chemical attacking of the polycrystalline semiconducting material so as to eliminate all the polycrystalline semiconducting material and, possibly, so as to slightly attack the monocrystalline material;
    (g) A seventh step for the selective growth, from a vapor phase of a monocrystalline semiconductor material in the space or spaces left free by the disappearance of the polycrystalline material.

2. A method according to claim 1 comprising:
an eighth step of localized etching or oxidation of the monocrystalline, semiconducting material located in the second aperture or apertures located in the second layer of insulating material, having a chemical attacking selectivity with respect to the adjacent layers and permitting neither nucleation nor deposition from the species of said vapor phase on its surfaces exposed to the vapor phase.
a ninth step of withdrawal of the layer of insulating material and of the oxidated, monocrystalline semiconducting material.

3. A method according to claim 2, comprising:
a tenth step of localized oxidation of the monocrystalline, semiconducting material in zones corresponding to the first apertures.

4. A method according to claim 3, comprising:
an eleventh step for the attacking of the semiconducting material oxidated during the tenth step.

5. A method according to claim 1, wherein the seventh step for the growth of monocrystalline, semiconducting material is stopped when this material reaches the flanks of the second apertures, said method comprising the following stages after the seventh step:
    a first stage for the attack and removal of the insulator of the second layer of insulating material;

a second stage for the deposition of an interposed material having chemical attacking selectivity with respect to the first layer of insulating material and to a third layer of insulator which will be deposited subsequently, in the apertures existing in the layer of monocrystalline material, and a planarization of the structure obtained;

a third stage for the deposition of a third layer of insulator;

a fourth stage for the etching of third apertures in the third layer of insulator above the interposed material;

a fifth stage for the removal of the interposed material through the third apertures;

a sixth stage for the selective growth and epitaxy of monocrystalline, semiconducting material through the third apertures.

6. A method according to claim 1, wherein said apertures are made in the form of bands.

7. A method according to claim 1, wherein each step or stage of attack or removal is followed by a cleaning step.

8. A method according to claim 1, wherein the substrate is silicon, gallium arsenide (GaAs), indium phosphide (InP), a III-V compound or a II-VI compound and wherein the semiconducting material is of the same nature.

9. A method according to claim 8, wherein the insulator is silica ($SiO_2$) or silicon nitride ($Si_3N_4$).

10. A method according to claim 1, wherein the seventh step is achieved so that there is an overrunning of the semiconducting material above the insulating material and wherein this seventh step is followed by a stage for the mechanical/chemical polishing of the semiconducting material until the surface of the insulating material is reached, the polishing being then stopped automatically by selectivity of the chemical reagent used.

11. A method according to claim 1 wherein the apertures made during the third step are oriented so that the facet of lateral growth made during the seventh step is not restricted.

12. A method according to claim 2, comprising a tenth step of localized etching of the monocrystalline, semiconducting material in zones substantially corresponding to the first apertures.

13. A method for the fabrication, by growth, through chemical vapor deposition, of at least one monocrystalline thin layer of a semiconducting material, wherein the crystal growth is initiated on a seed of a monocrystalline material of the same type as the semiconducting material of the thin layer to be obtained, and is confined between two layers made of a material distinct from the semiconducting material in such a way that, in the conditions of deposition used, there can occur neither nucleation or deposition of semiconducting material on the exposed surfaces of this distinct material or these distinct materials, the interval between the two layers of the distinct material or materials defining the thickness of the monocrystalline thin layer to be obtained, comprising the following steps:

a first step for the making of mesas of a determined height in a monocrystalline, semiconducting substrate;

a second step for the deposition on the substrate, between the mesas, of a dielectric material, the thickness of which is smaller than the height of the mesas;

a third step for the deposition, on the dielectric material, of an interposed material having a chemical attacking selectivity with respect to the dielectric material and to the layer of upper material which shall be deposited subsequently, the thickness of which is such that its addition to the thickness of the dielectric material enables the height of the mesas to be equalled;

a fourth step for the deposition, on all the mesas and on the entire interposed material, of a layer of an encapsulating material having chemical attacking selectivity with respect to the organic material and permitting neither nucleation nor deposition from the species of said vapor phase on the exposed surfaces of said encapsulating material;

a fifth step for the making of apertures in the layer of encapsulating material in zones ending on interposed material;

a sixth step for the removal, through the apertures, of the interposed material;

a seventh step for the selective growth in vapor phase, through the apertures, of a monocrystalline, semiconducting material of the same nature as the substrate.

14. A method according to claim 13, wherein the substrate is made of silicon, gallium arsenide (GaAs), indium phosphide (InP), or a III-V compound or a II-VI compound.

15. A method for the fabrication, by growth, through chemical vapor deposition, of at least one monocrystalline thin layer of a semiconducting material, wherein the crystal growth is initiated on a seed of a monocrystalline material of the same type as the semiconducting material of the thin layer to be obtained, and is confined between two layers made of a material distinct from the semiconducting material in such a way that, in the conditions of deposition used, there can occur neither nucleation nor deposition of semiconducting material on the exposed surfaces of this distinct material or these distinct materials, the interval between the two layers of the distinct material or materials defining the thickness of the monocrystalline thin layer to be obtained, comprising the following steps:

a first step for the making, on a monocrystalline, semiconducting substrate of at least one band formed by a layer of a dielectrical material, a layer of a semiconducting, interposed material and a layer of an insulating, encapsulating material having chemical attacking selectivity with respect to the adjacent layers and permitting neither nucleation nor deposition from the species of said vapor phase on its surfaces exposed to the vapor phase;

a second step for the growth, on the substrate, in the zone not occupied by said band, of a monocrystalline semiconducting material;

a third step for the oxidation of this monocrystalline semiconducting material;

a fourth step for the making of apertures in the encapsulating layer, having chemical attacking selectivity with respect to the adjacent layers and permitting neither nucleation nor deposition from the species of said vapor phase on its surface exposed to said vapor phase;

a fifth step for the elimination, through said apertures, of the layer of semiconducting, interposed material;

a sixth step for the selective growth, through said apertures, of a monocrystalline, semiconducting material.

16. A method according to claim 15, wherein the first step provides for the making, on the substrate, of a band having only one layer of a dielectric material and one layer of a semiconducting, interposed material and wherein the third step provides for the deposition of an encapsulating layer having chemical attacking selectivity with respect to the adjacent layers and permitting neither nucleation nor deposition from the species of said vapor phase on its surface exposed to the vapor phase on the entire structure;

17. A method according to claim 16, wherein the second step provides for a preliminary step for the etching of the layer of semiconducting interposed material.

18. A method for the fabrication, by growth, through chemical vapor deposition, of at least one monocrystalline thin layer of a semiconducting material, wherein the crystal growth is initiated on a seed of a monocrystalline material of the same type as the semiconducting material of the thin layer to be obtained, and is confined between two layers made of a material distinct from the semiconducting material in such a way that, in the conditions of deposition used, there can occur neither nucleation nor deposition of semiconducting material on the exposed surfaces of this distinct material or these distinct materials, the interval between the two layers of the distinct material or materials defining the thickness of the monocrystalline thin layer to be obtained, comprising the following steps;

a first step for the making, on a substrate, of at least one band of a dielectrical material;

a second step for the coating of these bands with a semiconducting, interposed material, having chemical attacking selectivity with respect to the other materials;

a third step for the coating of the unit thus obtained with an encapsulating material having chemical attacking selectivity with respect to the adjacent layers and permitting neither nucleation nor deposition from the species of said vapor phase on its surface exposed to the vapor phase;

a fourth step for the making of apertures in the encapsulating layer and above the band of dielectric material;

a fifth step for the removal, through the apertures of a layer of semiconducting, interposed material;

a sixth step for the selective growth and epitaxy through the apertures of a monocrystalline, semiconducting material;

a seventh step of oxidation of the monocrystalline semiconducting material in the apertures to provide a substantially planar monocrystalline semiconducting layer;

a eighth step where the encapsulating material and the oxidized monocrystalline semiconducting material in the apertures are removed.

19. A method according to claim 13, wherein the interposed material is organic.

20. A method according to claim 19, wherein the interposed material is a polyimide or a polymer.

21. A method according to claim 13, wherein the interposed material is mineral.

* * * * *